United States Patent [19]
Paulauskas et al.

[11] Patent Number: 5,603,795
[45] Date of Patent: Feb. 18, 1997

[54] JOINING OF THERMOPLASTIC SUBSTRATES BY MICROWAVES

[75] Inventors: Felix L. Paulauskas, Oak Ridge; Thomas T. Meek, Knoxville, both of Tenn.

[73] Assignee: Martin Marietta Energy Systems, Inc., Oak Ridge, Tenn.

[21] Appl. No.: 299,559

[22] Filed: Sep. 1, 1994

[51] Int. Cl.$^6$ ............................................. B32B 31/28
[52] U.S. Cl. .................................. 156/272.4; 156/272.2; 156/290
[58] Field of Search ........................... 156/272.2, 272.4, 156/379.7, 380.9, 290, 379.6

[56] References Cited

U.S. PATENT DOCUMENTS

| | | | |
|---|---|---|---|
| 3,519,517 | 7/1970 | Dench | 156/379.7 |
| 3,886,012 | 5/1975 | Slater | 156/290 X |
| 4,626,642 | 12/1986 | Wang et al. | 156/272.4 X |
| 4,906,497 | 2/1990 | Hellmann et al. | |
| 5,072,087 | 12/1991 | Apte et al. | 156/272.4 X |
| 5,094,709 | 3/1992 | Eichelberger et al. | 156/380.9 |
| 5,250,773 | 10/1993 | Lind et al. | |
| 5,254,824 | 10/1993 | Chamberlain et al. | 156/272.2 X |
| 5,279,694 | 1/1994 | DiSanto et al. | 156/380.9 X |
| 5,338,611 | 8/1994 | Lause et al. | |

FOREIGN PATENT DOCUMENTS

| | | | |
|---|---|---|---|
| 4036876 | 5/1992 | Germany | 156/272.2 |
| 0123020 | 7/1982 | Japan | 156/272.4 |

Primary Examiner—David A. Simmons
Assistant Examiner—Steven J. Helmer
Attorney, Agent, or Firm—Michael E. McKee; Joseph A. Marasco; Harold W. Adams

[57] ABSTRACT

A method for joining two or more items having surfaces of thermoplastic material includes the steps of depositing an electrically-conductive material upon the thermoplastic surface of at least one of the items, and then placing the other of the two items adjacent the one item so that the deposited material is in intimate contact with the surfaces of both the one and the other items. The deposited material and the thermoplastic surfaces contacted thereby are then exposed to microwave radiation so that the thermoplastic surfaces in contact with the deposited material melt, and then pressure is applied to the two items so that the melted thermoplastic surfaces fuse to one another. Upon discontinuance of the exposure to the microwave energy, and after permitting the thermoplastic surfaces to cool from the melted condition, the two items are joined together by the fused thermoplastic surfaces. The deposited material has a thickness which is preferably no greater than a skin depth, $\delta_s$, which is related to the frequency of the microwave radiation and characteristics of the deposited material in accordance with an equation.

12 Claims, 2 Drawing Sheets

JOINING OF THERMOPLASTIC SUBSTRATES BY MICROWAVES

BACKGROUND OF THE INVENTION

This invention relates generally to the joining together of two members and relates, more particularly to the joining, or bonding, together of items having surfaces which are defined by thermoplastic material.

Conventional methods of joining thermoplastic items, as by welding, involve heat conduction, convection, or radiation and friction, and the heat generated for these methods may be external or internal to the items, or both. For example, the high frequency or dielectric welding of thermoplastics is based on AC-generated waves passing through the plastic sheet or film, causing internal heating through molecular friction, with the subsequent temperature increase of the substrate material. However, this system is limited in that it is only applicable to a substrate with a sufficiently high dielectric loss tangent, i.e. a polymer with active polar groups. For this reason, this technique is usable only for polymers with the aforementioned chemical characteristics.

Other known techniques for welding thermoplastics, most of which involve the softening of areas to be joined to fusion temperature include hot gas welding, hot tool welding, induction welding, spin or friction welding, vibration welding or ultrasonic welding.

It is an object of the present invention to provide a new and improved method for joining together of items, or substrates, comprised of any of a number of types of thermoplastic material.

Another object of the present invention is to provide such a method which accommodates the rapid, low energy joining/bonding of thermoplastic materials.

Still another object of the present invention is to provide such a method which is well-suited for the sealing of printed circuit boards (PCBs) and printed wired boards (PWBs) during the manufacture of these boards.

SUMMARY OF THE INVENTION

This invention resides in a method for joining items together wherein the items have surfaces comprised of thermoplastic material.

The method includes the steps of depositing an electrically-conductive interfacial material upon the thermoplastic surface of at least one of the items, and then placing the other of the two items adjacent the one item so that the deposited material contacts the surfaces of both the one and the other items. The deposited material is subsequently exposed to microwave radiation so that the energy of the radiation heats the deposited material which, in turn, melts the thermoplastic surfaces in contact with the deposited material. Pressure is applied to the two items while the thermoplastic surfaces are in the melted condition so that the surfaces fuse together, and the thermoplastic surfaces are subsequently permitted to cool from the melted condition so that the two items are joined together by the fused thermoplastic surfaces.

The method is particularly well-suited for hermetically sealing printed circuit boards (PCBs) and printed wired boards (PWBs).

DETAILED DESCRIPTION OF THE ILLUSTRATIVE EMBODIMENTS

Figure 1:
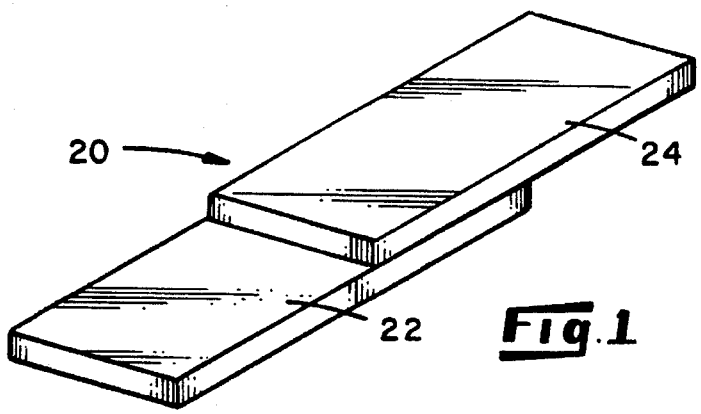
FIG. 1 is a perspective view of an assembly comprised of thermoplastic pieces which have been bonded together.

Turning now to the drawings in greater detail, there is shown in FIG. 1 an assembly, generally indicated 20, comprised of two pieces 22, 24 of thermoplastic material which have been joined together in accordance with an embodiment of the method of the present invention. To this end, a surface of at least one of the pieces 22, 24, i.e. one or both of the pieces 22, 24, is treated with an interfacial material, described herein, and then the pieces 22, 24 are arranged adjacent one another so that the interfacial material is sandwiched between and is in intimate contact with opposing surfaces of the pieces. The interfacial material is subsequently exposed to microwave radiation, and a uniaxial load is applied to the pieces 22, 24. By combining the effects of microwave radiation and the uniaxial loading applied to the pieces 22, 24, the pieces 22, 24 are tightly joined together.

The thermoplastic material out of which the pieces 22, 24 are comprised can be any of a number of thermoplastic material types. Examples of thermoplastic materials capable of being joined in accordance with this present invention include polymethyl methacrylate (PMMA) also known as Plexiglass, polycarbonate (PC), and low density polyethylene (LDPE).

Figure 2:
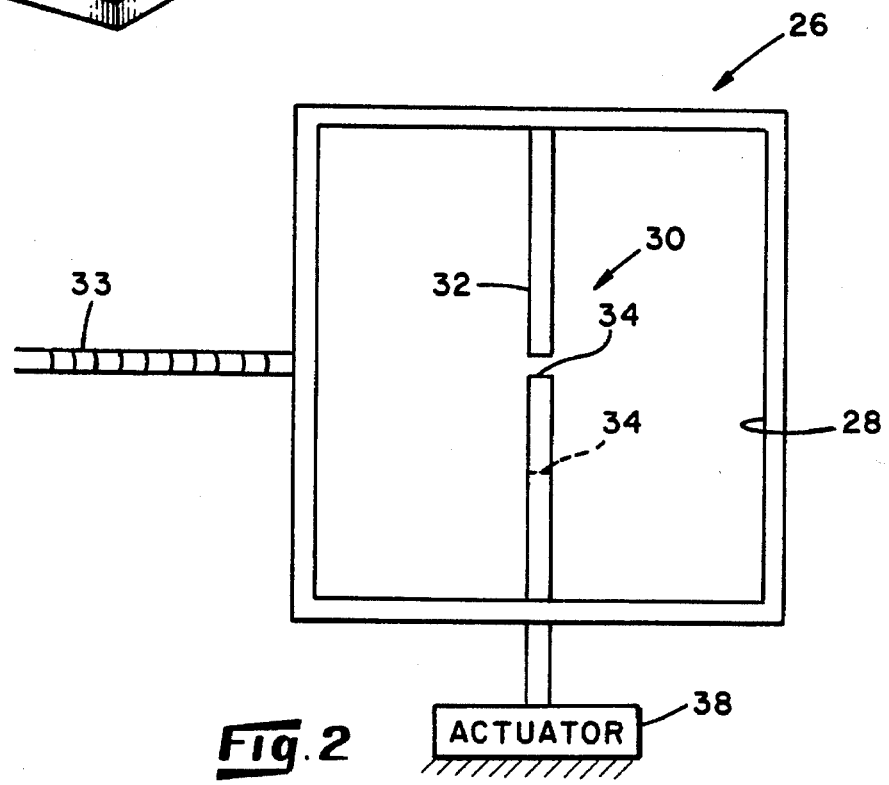
FIG. 2 is a view illustrating schematically an apparatus used to bond the pieces of the FIG. 1 assembly.

With reference to FIG. 2, there is schematically shown an exemplary apparatus, generally indicated 26, used to join the pieces 22, 24 of the FIG. 1 assembly 20. The apparatus 26 includes a chamber 28 within which the pieces 22, 24 are positioned, load-applying means, indicated 30, for applying a uniaxial load upon the pieces 22, 24, and means, indicated 33, for directing microwave energy into the chamber 28. The depicted apparatus 26 is a modified version of a commercially-available microwave oven within which has been installed the load-applying means 30. The load-applying means 30 of the apparatus 26 includes a pair of ceramic push rods 32, 34 which are each about 1.0 inches in diameter and which are mounted within the chamber 28 in substantially vertical registry with one another. Each of the push rods 32, 34 is transparent to microwave energy.

The upper push rod 32 is fixed in a stationary, or static, condition within the chamber 28, and the lower push rod 34 is mounted for movement toward and away from the push rod 32 between, for example, an upper position illustrated in solid lines in FIG. 2 and a lower position illustrated in phantom in FIG. 2. A loading device 38 associated with the lower push rod 34 is adapted to move the push rod 34 between its upper and lower positions to accommodate, on one hand, the positioning of the pieces 22, 24 therebetween and to apply, on the other hand, a load to the pieces 22, 24 when positioned between the rod ends.

Figure 3:
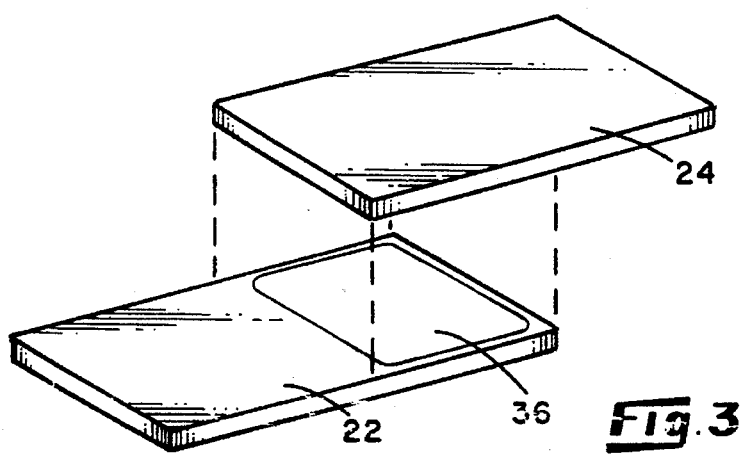
FIG. 3 is a perspective view of the FIG. 1 assembly, shown exploded.

Prior to the placement of the pieces 22, 24 within the apparatus chamber 28 and with reference to FIG. 3, an interfacial material 36, or media, is deposited upon the surface of at least one of the pieces 22 or 24 so that when the pieces 22, 24 are placed adjacent one another for joining purposes, the interfacial material 36 is positioned between so as to contact the surfaces of the pieces 22, 24 at which joinder is desired. The interfacial media 36 is an electrically conductive material which is deposited on one or both of the surfaces to be joined. The deposited material may provide a continuous film across a surface to be joined or may provide a discontinuous pattern, e.g. a series of film strips which alternate with bare, or uncoated, regions of the surface, and strips of the material may be embodied in a thin, metallic-based tape or foil which can be adhesively secured to one of the surfaces of the thermoplastic items. Still further, the material may be deposited at spaced locations upon the surface to provide a pattern of small, disconnected regions of deposited material.

As will be apparent herein, the application of microwave energy to the deposited interfacial material is intended to quickly heat the interfacial material so that the thermoplastic surfaces in contact with the interfacial material melt. Pressure is applied to the items while the is interfacial material is in a melted condition so that the melted surfaces fuse together. Thus, the thermoplastic surfaces must be capable of contacting one another through or around the deposited material. Therefore, the deposited material is preferably positioned upon (at least) one of the thermoplastic surfaces so that when the surfaces are positioned together in opposing relationship, there exists parts of the opposing surfaces between which no material is deposited. If the film is thin enough (so that cracks or fissures are developed in the film upon flow of the molten thermoplastic surfaces) or if the interfacial material is deposited at spaced locations, the fusing of opposing thermoplastic surfaces is effected through the fissures or around the particles of the material. In the instance in which film strips are deposited upon a thermoplastic surface so as to alternate with bare, or uncoated, regions of the surface, fusing of the opposing surfaces is effected at the uncoated surface regions. Further still, if the deposited material is applied as a thin metallic-based foil or tape, the foil or tape may be perforated to permit the desired exposure of the thermoplastic surfaces to one another when placed in opposing relationship.

Any of a number of processes may be employed to deposit the interfacial material 36 upon the thermoplastic surface. For example, the desired material deposit 36 can be effected by a sputtering process, a sprinkling process (which disperses the conductive material across the desired surface), a plasma deposition process, a spray-application process, or a solvent deposition process. In the latter-mentioned solvent deposition process, small particles of the conductive material are suspended in a solution which is applied to the desired thermoplastic surface. Upon evaporation of the solution, the particles remain upon the thermoplastic surface.

For optimum joining during the exposing step, it is preferable that the thickness of the interfacial material be no greater than the skin depth, defined below, of the interfacial material. Thus, it is preferred that during the deposition process, this skin depth of the selected interfacial material being deposited be regarded as a guide against which the thickness of the deposited material is measured. In some applications, the deposited material may exceed the skin depth, but in most instances, the thickness of the deposited material should be no greater than the skin depth of the selected interfacial material.

For purposes of the present invention, the skin depth, $\delta_s$, is the value of measure which is about equal to one divided by the square root of the product of the magnetic permeability of the interfacial material, the frequency of the incident radiation, the electrical conductivity of the interfacial material and $\pi$. Thus, the skin depth, $\delta_s$, is related to the frequency of the microwave energy applied in the exposing step and to characteristics of the electrically-conductive interfacial material in accordance with the equation:

$$\delta_s = 1/[\pi f \sigma \mu]^{1/2}$$

wherein f is the frequency of the microwave radiation to which the deposited material and the thermoplastic surfaces are exposed during the joining step, $\sigma$ is the electrical conductivity of the electrically-conductive material, and $\mu$ is the magnetic permeability of the interfacial electrically-conductive material.

During the exposing step wherein the deposited material is exposed to microwave radiation, a large percentage of the energy of the radiation is absorbed by the deposited material which heats the material in a very short period of time. The heated material, in turn, melts the thermoplastic surfaces in contact therewith so that upon application of the appropriate pressure, the surfaces fuse together. For this purpose, the deposited material should not be so thin that insufficient radiation is absorbed by the deposited material (for heating purposes) and should not so thick that the mass of the deposited material absorbs the bulk of the heat generated by the radiation or so that the microwave energy begins to reflect within the chamber. In addition, the efficiency of the process may decrease with an increase in the thickness of the deposit above the above-defined skin depth.

Thus, the guide or standard against which the thickness of the deposited material is preferably compared is the above-defined skin depth. As mentioned earlier, there may be instances in which the thermoplastic surfaces will fuse with one another when the deposited material is greater than the skin depth of the deposited material, but in most applications, the thickness of the deposited material should be no greater than the skin depth. Thus, suitable control is preferably maintained over the deposition process to limit the deposit thickness to no more than about the skin depth so that when exposed to microwave radiation, the deposited material causes electronic heating to take place and enhances coupling efficiency. By way of example, the skin depth of each of various electrically-conductive metals (calculated for a microwave frequency of about 2.45 GHz and at room temperature) is as follows: for aluminum, the skin depth is about 1.74 μm; for copper, the skin depth is about 1.34 μm; and for gold, the skin depth is about 1.58 μm.

A suitable interfacial media, such as gold, can, by way of example, be sputter-deposited upon the surfaces or either or both of the pieces 22, 24. During a deposition process during which gold was deposited upon the pieces 22, 24 for use as an interfacial media, the sputtering times for gold deposition can vary from 2 minutes to 12 minutes resulting in deposited gold films having thicknesses of between 100 and 800Å.

It follows that the assembly joining procedure involves an initial step of treating one or both pieces 22 or 24 of thermoplastic material with the desired interfacial media 36 and then placing the pieces 22, 24 adjacent one another so that the media film 36 is sandwiched between and in intimate contact with the surfaces of both of the pieces 22, 24. Preferably, the surfaces desired to be joined are complimentary in shape so that when placed together, a relatively large region of each surface contacts a corresponding face of the interfacial media. The pieces 22, 24 are then placed within the FIG. 2 chamber 28 into a position between the (spaced) ends of the ceramic push rods 32, 34, and the lower push rod 34 is moved upwardly so that the pieces 22 and 24 and the media film 38 are compressed between the ends of the rods 32, 34. A uniaxial load is applied to the pieces 22, 24, i.e. to the region of the pieces 22, 24 desired to be joined together, and the pieces 22, 24 are exposed to microwave radiation while the load is maintained. The microwave energy level, the pressure and time of exposure of the interfacial material to the microwave energy and pressure are sufficient to obtain an acceptable joining/bonding of the thermoplastic pieces 22, 24. Upon completion of the joining operation wherein the melted thermoplastic surfaces are pressed so as to bond together, the microwave energy is turned off, and the application pressure is continued for a brief period of time, e.g. for a few seconds, while the bonded surfaces cool from the melted condition. Once the pieces reach a satisfactory (cooled) temperature, the pieces are removed from between the rods as a joined assembly.

During formation of samples for testing wherein each sample included pieces comparable in size to the pieces 22 and 24, about 2.45 GHz radiation was applied to the deposited material in discrete steps while a constant load of about twenty-five pounds was maintained. Between the intervals of the microwave radiation exposure, the pieces were inspected to ensure joint integrity. Experiments can be conducted to determine (or optimize) process variables of the operation, such as compression load and the characteristics of its application over time (e.g. constant load versus varying load), input microwave power level and exposure time, as well as selected characteristics of the interfacial media, such as the coating thickness and the chemically/ physically interactive affinity with the substrate.

Experimental samples comprised of various thermoplastic materials have been joined together in accordance with the method of the present invention with an interfacial media of gold film and subsequently exposed to strength tests. More specifically, samples whose pieces have overlapping, or joined areas, of between 0.5 and 0.75 inches in length by about 1.0 inches in width were tested in accordance with the ASTM D1002 standard lap-shear test. While it is recognized that this ASTM test was developed to test the joining of metal sheets, and not thermoplastic materials, it is believed that the results of the tests still provide sufficient evidence that the joint strength of thermoplastic pieces joined by the foregoing method is very good. The following Table 1 sets forth characteristics and test results performed with various ones of the experimental samples which were each exposed to 2.45 GHz radiation and a constant load of about twenty-five pounds during the joining process.

The relatively high strength test values shown in Table 1 above demonstrate that the samples are well-joined by the aforedescribed method. Not indicated in Table 1 was additional work in joining of hybrid substrate combinations PMMA/LDPE and PC/LDPE. These combinations proved to be equally well-joined by the aforedescribed method.

The interfacial media, such as a conductive metal, used in the joining process not only produces an excellent joint between thermoplastics, it also provides a joint which has excellent electrical conductivity. Contrary to other conventional joining techniques wherein metallic interfacial media is a difficulty, this process easily provides for a metallic interface. This metallic interface/bonding will provide an electrically conductive path for protection ground, EMI (electromagnetic interference), and for conventional electrical conductor pathways.

Figure 4:
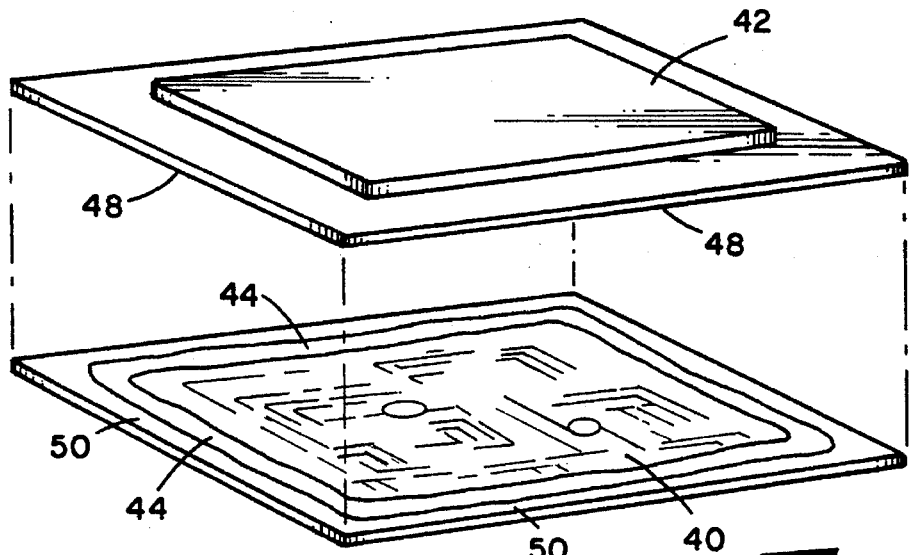
FIG. 4 is a perspective view of a printed circuit board and an encapsulating member with which the circuit board can be sealed in accordance with the method of the present invention.

As an example, the method described above is particularly well-suited for sealing printed circuit boards (PCBs) and printed wired boards (PWBs), and is especially suited for sealing PCBs or PWBs constructed of, i.e. having substrates constructed of, thermoplastic material. Moreover, the thermoplastic material out of which the PCB or PWB may be comprised can be either flexible or rigid. For example and with reference to FIG. 4, there is shown a thermoplastic printed circuit board 40 which can be hermetically sealed with a thermoplastic piece 42 in accordance with the method of the present invention. The depicted board 40 includes a base, or substrate, which is comprised of a thermoplastic material is planar in form. The encapsulation piece 42 has an open, box-like geometry (arranged in FIG. 4 so that its box-like shape opens downwardly) and is sized so that when placed in overlying relationship with the board 40, the peripheral edges, indicated 48, of the piece overlie the peripheral edges, indicated 50, of the board 40.

To prepare the board 40 and encapsulating piece 42 for the eventual exposure to compression and microwave radiation, the peripheral edges 50, 48 of either one or both of the board 40 and piece 42 are treated with a suitable interfacial media, e.g. an electrically-conductive material. More specifically, the surfaces of the peripheral edges 48, 50 which oppose one another when the piece 42 is placed in overlying relation with the board 40 are coated therearound with a continuous strip, indicated 44, of the interfacial media. The piece 42 is subsequently placed in the desired overlying relationship with the board 40 so that the media film 44 is sandwiched between the peripheral edges 50, 48 of the board 40 and piece 42.

Compression is then applied to the board 40 and piece 42 about the regions thereof where the joining is desired. Therefore, in this example, compression is applied to the

TABLE 1

| Substr. Mat'l | Substr. Thickness | Interf'l Media | Pwr(kw) Input | Refl'ed Pwr | Exposure* Time (min) | S. Lap-Sh Strength |
|---|---|---|---|---|---|---|
| PMMA/PMMA (Au16) | 3/16" | Gold Film 6 min/ea side sputter time | 1.0 | 0.0** | 1.3 | 57 psi |
| PMMA/PMMA (Au18) | 3/16" | Gold Film 12 min/ea side sputter time | 1.0 | 0.0 | 1.0 | 245 psi |
| LDPE/LDPE (Au15) | 1/8" | Gold Film 7 min/ea side sputter time | 1.0 | 0.0 | 4.5 | 48 psi |

Figure 5:
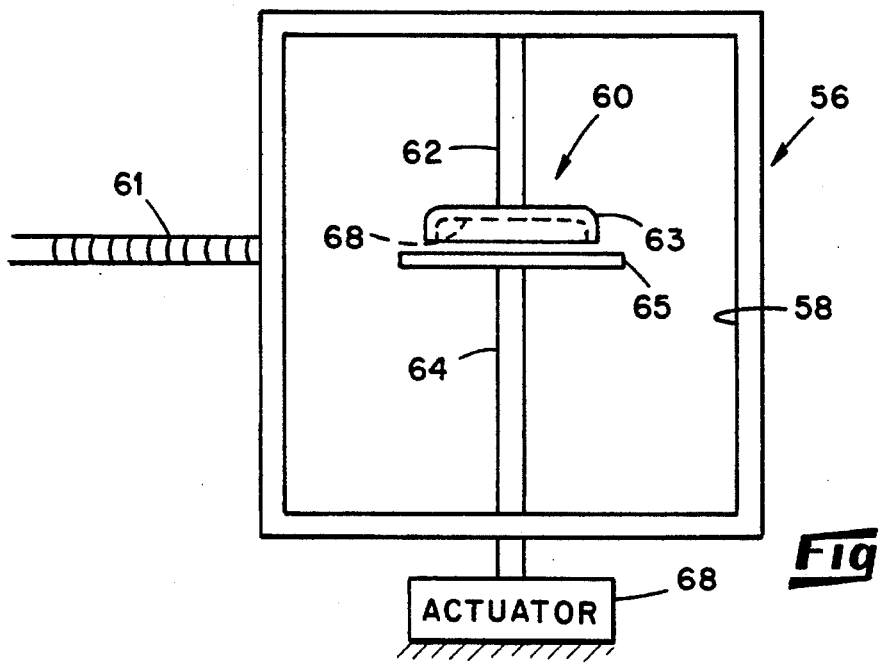
FIG. 5 is a view illustrating schematically an apparatus used to seal the board and encapsulating member of FIG. 4.
Figure 6:
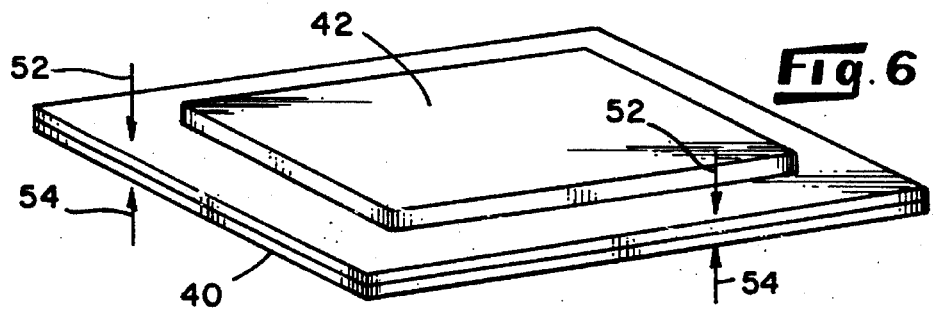
FIG. 6 is a perspective view of the printed circuit board and encapsulating member of FIG. 4, shown joined together.

*The exposure time indicates the time that the sample is compressed between the two push rods and subjected to the indicated microwave power.
**The reflected power in each instance was determined to be negligible for any practical purpose.

board 40 and piece 42 so that the peripheral edges thereof are compressed. As shown in FIG. 5, there is depicted an exemplary apparatus 56 within which the board 40 and piece 42 are compressed in the desired manner and microwave energy is directed toward the board 40 and piece 42 when under compression. The apparatus 56 includes a chamber 58 within which the board 40 and piece 42 are positioned, load-applying means, indicated 60, for applying a uniaxial load upon the board 40 and piece 42, and means, indicated 61, for directing microwave energy into the chamber 68.

The load-applying means 60 of the apparatus 56 includes a pair of ceramic push rods 62, 64 which are mounted within the chamber 68 in registry with one another. Ceramic fixture members 63, 65 of a specific, e.g. required, geometry for the application at hand are attached to the ends of the rods 62, 64 so that the load applied to the load-applying means 60 is transmitted through the fixtures 63, 65 to the peripheral edges of the board 40 and piece 42. The underside of the upper fixture member 63 includes a recess 68 which ensures that as pressure is applied to the board 40 and piece 42 along the peripheral edges thereof, no part of the central sections of the board 40 and piece 42 are compressed by the fixture members 63, 65. Each of the fixture members 63, 65 and push rods 62, 64 are transparent to microwave energy.

The upper push rod 62 is fixed in a stationary, or static, condition within the chamber 58, and the lower push rod 64 is mounted for movement of its fixture member 65 toward and away from the push rod 62. A loading device 68 associated with the lower push rod 64 is adapted to move the push rod 64 between its upper and lower positions to accommodate, on one hand, the positioning of the board 40 and pieces 42 therebetween and to apply, on the other hand, a load to the pieces 22, 24 when positioned between the rod ends. It follows, therefore, that when the board 40, with the piece 42 laid thereover, is positioned between the fixture members 63, 65 and a load is applied with the push rods along the peripheral edges of the board 40 and piece 42, such as in the direction indicated by the arrows 52, 54 of FIG. 5, so that the deposit of interfacial material is in a compressed state between the opposing surfaces of the board 40 and piece 42. With the load continually applied to the peripheral edges of the board and piece, the peripheral edges are exposed to microwave radiation to bond the board and piece along the edges thereof. As a result of this bonding process, the board 40 is hermetically sealed with the piece 42 and thereby protected from exposure to air, moisture or other contaminants.

Although the aforedescribed encapsulating piece 42 has been shown and described as having an open box-like geometry, an encapsulating piece may possess another geometry, such as that resembling a dome, a bell or a Petri-dish. In any case, a thin film coating of a suitable interfacial media is deposited along a perimetal surface of the selected circuit board surface or along the edges of the wall of the encapsulating dome, box or dish suitably shaped to encapsulate the board when placed thereagainst. The encapsulating or enclosure dome, box or dish is then exposed to suitable uniaxial load or pressure with an accompanying exposure to microwave radiation. This approach will cause a superior encapsulation of the entire area or, if desired, selective areas of the PCB or PWB.

Still further, although the aforedescribed printed circuit board 40 has been described as having a base, or substrate, comprised entirely of thermoplastic material, the aforedescribed procedure is applicable to PCBs and PWBs comprised, in part, of other materials, such as a thermoset material. It is important, however, that the surface of the PCB or PWB to be bonded in accordance with the method described herein be defined by a thermoplastic material. Therefore, during the construction of a PCB or PWB to be encapsulated in accordance with the techniques described herein and wherein the PCB or PWB involves the build up of the board in successive layers, a thermoset material can be utilized to construct the interior layers of the board, while a thermoplastic material can be used to construct the exterior layers of the board or by providing, through alternative means or processes, a thermoplastic peripheral area or sector (e.g. by application of a thermoplastic adhesive tape).

Furthermore, the aforedescribed encapsulation process also renders possible the encasement of all or a portion of the circuit board elements in a desired atmosphere such as, for example, dry nitrogen. In the instance that the circuit board is perforated, both sides, one side or sectors of the PCB or PWB may be encapsulated in one operation by using a sealing material, such as a foil, as an underside component and appropriately coating the components (or edges thereof) with a suitable interfacial media. It should also be noted that this process may be suitable for the selective enclosure of regions of a PCB or PWB. For example, the back or other selected region of a PCB or PWB-baseboard (which may or may not be used to support active electronic elements) may also be hermetically sealed by this technique. The electrically-conductive paths which have been fabricated on the PCB or PWB-baseboard may also be used as the metallic interfacial media for hermetic sealing purposes.

The aforedescribed process of sealing PCBs and PWBs are advantageous when compared to the current processes involved in the manufacture of printed circuit boards (PCBs) and printed wired boards (PWBs) require time-consuming and energy-intensive methods. Further, selective hermetic sealing of PCBs and PWBs by conventional techniques is difficult, tedious and expensive to accomplish. The processing technique described above requires less time and may be accomplished with in-situ printed circuit fabrication. The resultant circuit boards are hermetically sealed against any exterior agent, such as a gas, liquid or solid.

This process is applicable to almost any type of industrial or consumer electronic apparatus. Also, this invention may be used to process composite laminates while at the same time incorporating electronic circuitry within or atop the laminates. For example, electronic circuitry may be fabricated between composite layers which comprise strain gauge capability to monitor stress-strain behavior, surface temperature and pressure in-situ with the operation of the laminate material.

It will be understood that numerous modifications and substitutions can be had to the aforedescribed embodiment without departing from the spirit of the invention. For example, although the foregoing descriptions have focused upon the joining of items having integral thermoplastic surfaces, items which are not constructed of thermoplastic material may have thermoplastic material bonded to the surfaces thereof for the purpose of joining the items together in accordance with the aforedescribed method. To this end, a thermoplastic tape can be adhesively bonded to the surfaces of the items for acceptance of the interfacial material deposited thereon. Alternatively, a metallic tape or foil having a thermoplastic substrate can be adhesively secured to the surface of an item so that the substrate provides the thermoplastic layer and the metal of the tape provides the interfacial media for the joining operation.

Further still, although the foregoing method has been shown and described as involving the joinder of only two items together whose surfaces are provided by thermoplastic material, it will be understood that the method can be used to join more than two, i.e. two or more, of such items together. For example, it may be desired for a specific application to construct an assembly of thermoplastic items wherein three or more items are joined in a stacked or layered arrangement. In such an instance, a layer of interfacial material is deposited between each item so that when the items are stacked in the desired arrangement, each layer of interfacial material is in intimate contact with the surfaces of the adjacent items. The layered arrangement is subsequently exposed to pressure and microwave radiation to bond the layers together.

Accordingly, the aforedescribed embodiment is intended for the purpose of illustration and not as limitation.

We claim:

1. A method for joining two items having surfaces of thermoplastic material, the method comprising the steps:

depositing an electrically-conductive material upon the thermoplastic surface of at least one of the items;

placing the other of the two items adjacent the one item so that the deposited material contacts the surfaces of both the one and the other items;

exposing the deposited material to microwave radiation so that the energy of the radiation heats the deposited material which, in turn, melts the thermoplastic surfaces in contact with the deposited material;

applying pressure to the two items while the thermoplastic surfaces are in the melted condition so that the surfaces fuse together; and permitting the thermoplastic surfaces to cool from the melted condition so that the two items are joined together by the fused thermoplastic surfaces; and wherein the electrically-conductive material deposited during the depositing step has a thickness, and the thickness of the deposited electrically-conductive material is no greater than the skin depth, $\delta_s$, defined in accordance with the equation:

$$\delta_s = 1/[\pi f \sigma \mu]^{1/2}$$

wherein f is the frequency of the microwave radiation to which the deposited material and the thermoplastic surfaces are exposed during the exposing step, $\sigma$ is the electrical conductivity of the electrically-conductive material, and $\mu$ is the magnetic permeability of the electrically-conductive material.

2. The method as defined in claim 1 wherein the exposing step is discontinued prior to the permitting step.

3. The method as defined in claim 2 wherein the exposing step and the pressure-applying step overlap one another and the pressure-applying step is continued for a brief period of time following discontinuance of the exposing step.

4. The method as defined in claim 2 wherein the pressure-applying step and the permitting step overlap one another.

5. The method as defined in claim 1 wherein the electrically-conductive material deposited upon the thermoplastic surface during the step of depositing is an electrically-conductive metal.

6. A method for joining two items having surfaces of thermoplastic material, the method comprising the steps of:

depositing an electrically-conductive material upon the thermoplastic surface of at least one of the items;

placing the other of the two items adjacent the one item so that the deposited material contacts the surfaces of both the one and the other items;

applying pressure to the two items so that the deposited material is compressed between the surfaces; and exposing the deposited material to microwave radiation while the two items are maintained under pressure so that the energy of the radiation heats the deposited material which, in turn, melts the thermoplastic surfaces in contact with the deposited material so that the thermoplastic surfaces bond together to join the two items to one another; and wherein the electrically-conductive material deposited during the exposing step has a thickness, and the thickness of the deposited electrically-conductive material is no greater than the skin depth, $\delta_s$, defined in accordance with the equation:

$$\delta_s = 1/[\pi f \sigma \mu]^{1/2}$$

wherein f is the frequency of the microwave radiation to which the deposited material and the thermoplastic surfaces are exposed during the exposing step, $\sigma$ is the electrical conductivity of the electrically-conductive material, and $\mu$ is the magnetic permeability of the electrically-conductive material.

7. The method as defined in claim 6 wherein the surfaces to be joined are generally complimentary in shape so that when the items are placed adjacent one another in the placing step, relatively large areas of the surfaces to be joined contact the deposited electrically-conductive material.

8. The method as defined in claim 6 wherein the step of depositing is effected by one of a sputtering, sprinkling, plasma deposition, spray, and solvent deposition process or the positioning of a perforated thin film, foil or tape over the thermoplastic surface.

9. The method as defined in claim 6 wherein the electrically-conductive material deposited upon the thermoplastic surface during the step of depositing is an electrically-conductive metal.

10. The method as defined in claim 6 wherein the pressure applied to the two items during the pressure-applying step is a uniaxial load.

11. The method as defined in claim 6 wherein the thermoplastic material providing the surface of at least one of the thermoplastic items includes one of a group of materials consisting of polymethyl methacrylate (PMMA), polycarbonate (PC) and polyethylene (PE).

12. A method for encapsulating at least a portion of a printed circuit board (PCB) or a printed wired board (PWB) with at least one thermoplastic encapsulating piece wherein the PCB or PWB is backed by a substrate having thermoplastic surfaces including peripheral edges disposed about the portion of the PCB or PWB desired to be encapsulated so that a continuous and unbroken surface of thermoplastic can be traced along the peripheral edges and about the portion of the PCB or PWB desired to be encapsulated, the method comprising the steps of:

depositing an electrically-conductive material along the peripheral edges of at least one of the thermoplastic piece and the substrate so that the portion of the PCB or PWB desired to be encapsulated is encompassed by the deposited material;

placing the thermoplastic piece and the substrate adjacent one another so that the deposited material contacts the continuous and unbroken surfaces of thermoplastic of both the piece and the substrate encompassing the portion of the PCB or PWB desired to be encapsulated;

applying pressure to the thermoplastic piece and the substrate so that the deposited material is compressed between the surfaces of the piece and the substrate; and exposing the deposited material and the thermoplastic surfaces contacted thereby to microwave radiation while the piece and substrate are maintained under pressure so that the thermoplastic piece and the substrate bond together along a continuous and unbroken path about the portion of the PCB or PWB to encapsulate the portion of the PCB or PWB between the piece and the substrate.

* * * * *

UNITED STATES PATENT AND TRADEMARK OFFICE
CERTIFICATE OF CORRECTION

PATENT NO. : 5,603,795
DATED : February 18, 1997
INVENTOR(S) : Felix L. Paulauskas et al It is certified that error appears in the above-indentified patent and that said Letters Patent is hereby corrected as shown below:

Column 1, between the title ending on line 2 and the heading "Background of the Invention" on line 7, the following paragraph should appear:

--This invention was made with Government support under Contract No. DE-AC05-96OR22464 awarded by the Office of Basic Energy Sciences Chemical Sciences Division of the U.S. Department of Energy to Lockheed Martin Energy Research Corporation, and the Government has certain rights in the invention.--

Signed and Sealed this

Ninth Day of March, 1999

Attest:

Q. TODD DICKINSON

*Attesting Officer*    *Acting Commissioner of Patents and Trademarks*